United States Patent [19]

Nanpei et al.

[11] Patent Number: 4,544,624

[45] Date of Patent: Oct. 1, 1985

[54] PHOTOSENSITIVE RESIN COMPOSITION

[75] Inventors: Masaru Nanpei, Mie; Akira Tomita, Shiga; Toshiaki Fujimura, Shiga; Kuniomi Etoh, Shiga, all of Japan

[73] Assignee: Toyo Boseki Kabnushiki Kaisha, Osaka, Japan

[21] Appl. No.: 688,402

[22] Filed: Jan. 2, 1985

Related U.S. Application Data

[63] Continuation of Ser. No. 466,675, Feb. 15, 1983, abandoned.

[30] Foreign Application Priority Data

Feb. 15, 1982 [JP] Japan ................................ 57-23266

[51] Int. Cl.[4] ................................................ G03C 1/68
[52] U.S. Cl. ................................ 430/281; 204/159.19; 204/159.22; 430/283; 430/284; 430/906; 528/68; 525/424; 525/440; 525/452
[58] Field of Search ............... 430/283, 284, 298, 281, 430/906; 525/424, 440, 452; 528/69; 204/159.19, 159.22

[56] References Cited

U.S. PATENT DOCUMENTS

| | | | |
|---|---|---|---|
| 3,924,023 | 12/1975 | Boranian et al. | 427/54.1 |
| 4,019,972 | 4/1977 | Faust | 204/159.19 |
| 4,085,019 | 4/1978 | Green | 204/159.19 |
| 4,186,069 | 1/1980 | Muzyczko et al. | 430/283 |
| 4,216,267 | 8/1980 | Lorenz et al. | 430/283 |
| 4,234,399 | 11/1980 | McDowell et al. | 204/159.19 |
| 4,250,248 | 2/1981 | Faust | 204/159.19 |

Primary Examiner—Jack P. Brammer
Attorney, Agent, or Firm—Armstrong, Nikaido, Marmelstein & Kubovcik

[57] ABSTRACT

The invention provides a photosensitive resin composition containing a soluble synthetic linear high-molecular compound in an amount of 25 to 95 weight percent based on the whole composition, a monomer having at least one photopolymerizable unsaturated bond and a photopolymerization initiator and characterized in that part or all of the soluble synthetic linear high-molecular compound is an addition polymer of an organic diisocyanate compound with an amide compound, both terminals of the amide compound being either primary or secondary amide groups and the equivalent ratio of amino groups to isocyanate groups in the addition polymer is not less than 1.0. The high-molecular weight compound makes up at least 50% by weight base on the total amount of the polymer material present in the composition.

6 Claims, No Drawings

PHOTOSENSITIVE RESIN COMPOSITION

This application is a continuation of application Ser. No. 466,675, filed Feb. 15, 1983, now abandoned.

The present invention relates to a novel photosensitive resin composition. More particularly, in photosensitive resin compositions (hereinafter referred to as "composition") containing as essential component a soluble synthetic linear high-molecular compound, a monomer having photopolymerizable unsaturated bond(s) (hereinafter referred to as "photopolymerizable unsaturated compound") and a photo-initiator, the present invention relates to a novel composition characterized in that a part or all of said soluble synthetic linear high-molecular compound (hereinafter referred to as 37 filling polymer") is an addition polymer of diisocyanate compound(s) with amide compound(s) having primary or/and secondary amino groups at both terminals as well as one or more amide bonds.

Hitherto, compositions containing as basic component a filling polymer, a photopolymerizable unsaturated compound and a photopolymerization initiator are well known, and they are widely used as printing plates (relief printing or lithography), photo-resists, displays, photo-curable paints, UV-curable inks, other image-forming materials and the like.

As the filling polymer, polyamides, cellulose derivatives, polyvinyl alcohol derivatives, unsaturated polyesters, synthetic rubbers and the like are used. Of these, compositions made particularly of polyamides, when used for example in relief printing, because of polyamides being superior in solvent resistance, abrasion resistance and other performances and physical properties, are widely used as a raw material for high-quality and high-performance printing plates superior in long press life, resistance to ink solvent, resolving power and the like. Generally, however, polyamides tend to be inferior to compatibility with a photopolymerizable unsaturated compound used in combination, and therefore with polyamide type compositions, it is difficult to blend large quantities of the compound. Many photopolymerizable unsaturated compounds superior in compatibility with polyamides have so far been proposed, but it may be said that satisfactory compounds are not yet always found. This may be presumed to be due to the too strong polarity of polyamides.

Because of diversified uses of printing, for example for photosensitive resin plates for relief printing is required a wide range of grade ranging from high-hardness grades in which the hardness of composition after photo-curing is about 85° in Shore D to super-softness grades having flexibility and elasticity of about 40° in Shore A. But, with photosensitive resin plates of which the filling polymer is conventional commercially available polyamides, such high-hardness grades and super-softness ones having flexibility and elasticity are not obtained. Further, high-performance printing machines for improvement in printing productivity were developed to make a high-speed printing of several hundred meter/min. possible, but it may be said that development of materials for printing plate which withstand such speed-up of printing is not always in a satisfactory condition. At the present time, therefore, there is a desire for the appearance of such materials for printing plate to satisfy all of the needs as described above.

As a result of extensive study, the present inventors found a novel composition which retains the foregoing advantages of polyamides and besides has a superior compatibility with photopolymerizable unsaturated compound, and which enables the hardness of printing plate to be controlled over a wide range. The present inventors thus attained to the present invention.

That is to say, the present invention provides the following composition: In photosensitive resin compositions containing as basic component a soluble synthetic linear high-molecular compound, monomer(s) having photopolymerizable unsaturated bond(s) and a photopolymerization initiator, a novel photosensitive resin composition characterized in that a part of all of said soluble synthetic linear high-molecular compound is an addition polymer of a diisocyanate compound with an amide compound having, at the both terminals, primary and/or secondary amino groups as well as one or more amide bonds.

The soluble amide compound, as used in the present invention, having the both terminals which are substantially a primary or/and a secondary amino group as well as one or more amide bonds, includes homopolymers, copolymers, oligomers and mixtures thereof synthesized from diamine(s) and dicarboxylic acid(s), $\omega$-amino acid, lactam or derivatives thereof all of which are conventionally well known. A method to make the both terminals of said amine compound substantially primary or/and a secondary amino group(s), is possible by using the mole number of the diamine component having primary or/and secondary amino group(s) is excess of the mole number of the other component, dicarboxylic acid(s). In the case of the $\Phi$-amino acid or lactam, the method is possible by adding the well-known primary or/and secondary diamine. In this case, the molecular weight of the amide compound can be controlled by controlling the degree of excess of the diamine.

The average molecular weight of the amide compound used in the present invention is 300 to 20,000, particularly preferably 500 to 15,000. The amide compound used in the present invention may also contain hetero atom(s) or group(s) such as basic tertiary nitrogen atom, ammonium salt type nitrogen atom, or sulfonate, polyether or polythioether group on its main chain and/or side chains. Also, said amide compound may be not only homopolymer, but also random copolymer, block copolymer, oligomer or mixtures thereof, and it is an amide compound having, at the both terminals, primary or/and secondary amino groups as well as one or more amide bonds which is soluble in the conventionally well-known solvents such as water, aqueous acidic solutions, aqueous alkaline solutions, lower fatty alcohols and mixtures thereof. As specific examples of such amide compound, there are given for example various kinds of nylon such as nylon 6, nylon 6,6 nylon 6,10, nylon 6/6,6/10 copolyamide, nylon 6/6,6/6,12 copoolyamide, etc.; and polyamides and oligoamides of which the both terminals are substantially a primary or/and a secondary amino group such as polyamide obtained from m-xylylene diamine/adipic acid, polyamide obtained from 1,3-bis(aminomethyl)cyclohexane/adipic acid, polyamide obtained from 2,2,4-trimethylhexamethylene diamine and/or 2,2,4-trimethylhexamethylene diamine/adipic acid, $\epsilon$-caprolactam/adipic acid/hexamethylene diamine/4,4'-diaminodicyclohexylmethane copolyamide, polyamide obtained from N,N'-bis(3-aminopropyl)piperazine/sebacic acid $\epsilon$-caprolactam/N,N'-bis(3-aminopropyl)-piperazine/adipic acid copolyamide, $\epsilon$-caprolactum/N-(2-aminoethyl)piperazine/adipic acid copolyamide, N,N'-bis(3-aminopropyl)piperazine/adipic acid/sebacic acid copolyamide, polyamide obtained from α-N,N-dimethylamino-ε-caprolactum, ε-caprolactam/α-N,N-dimethylamino-ε-caprolactam copolyamide, α-N,N-dimethylamino-ε-caprolactam/nylon 6,6 copolyamide, ε-caprolactum/α-N,N-dimethylamino-εcaprolactum/-nylon 6,6 copolyamide, ε-caprolactum/α-N,N-dimethylamino-ε-caprolactam/nylon 6,6/nylon 6,10 copolyamide, polyamide obtained from α-N,N-dimethylamino-ω-aminocaproic acid and its copolyamide, polyamides obtained from these polyamides, copolyamides or oligoamides by converting a part or all of the basic tertiary nitrogen atoms thereof to ammonium salts, polyamide obtained from α,ω-diaminopolyoxyethylene/adipic acid, polyamide obtained from α,ω-diaminopolyoxypropylene/adipic acid, ε-caprolactam-/α,ω-diaminopoly(oxyethylene-oxypropylene)/adipic acid copolyamide, ε-caprolactam/hexamethylene diamine/adipic acid/5-sodium sulfoisophthalic acid copolyamide, ε-caprolactam/hexamethylene diamine/adipic acid/2,4-diphenoxy-6-[p-(sodium sulfophenylamino]-s-triazine copolyamide and the like. Of these amide compounds having the both terminals which are substantially a primary or/and a secondary amino group as well as one or more amide bonds, those which are preferred in the present invention are compounds having basic tertiary nitrogen atoms and/or having a part of all of these nitrogen atoms converted to ammonium salts, and compounds having polyoxyethylene and/or polyoxypropylene group(s).

In the present invention, the content of the foregoing amide compound which has reacted with diisocyanate in the filling polymer is not less than 5 wt. %. When the content is less than 5 wt. %, the physical property of the composition after photo-curing lowers, so that such content is not desirable. So far as the performance and physical property of the composition are not damaged, primary or/and secondary diamines having no amide bond in the molecular may be used together.

The diisocyanate compound for reaction with the foregoing amide compound in the present invention may be diisocyanate alone or diisocyanate/glycol adducts substantially having isocyanate groups at the both terminals. As the diisocyanate compound, there may be given for example 2,4-tolylene diisocyanate, 2,6-tolylene diisocyanate, 1-methyl-2,4-cyclohexane diisocyanate, 1-methyl2,6-cyclohexane diisocyanate, 4,4'-diphenylmethane diisocyanate, 4,4'-dicyclohexylmethane diisocyanate, dianisidine diisocyanate, 3,3'-ditolylene-4,4'-diisocyanate, hexmethylene diioscyanate, m-xylylene diisocyanate, 1,3-cyclohexanedimethylisocyanate, p-xylylene diisocyanate, 1,5-naphthalene diisocyanate, trans-vinylene diisocyanate, 2,6-diisocyanate methylcaproate, diphenylether-4,4'-diisocyanate, isophorone diisocyanate and the like. Of these, hexamethylene diisocyanate, isophorone diisocyanate and 1,3-cyclohexanedimethylisocyanate are preferred. The foregoing diisocyanate compounds may be used alone or in combination.

As glycol for addition reaction with the diisocyanate compound, there may be given for example alkylene glycols such as ethylene glycol, 1,2-propanediol, 1,3-propanediol, tetramethylene glycol, neopentyl glycol, 1,5-pentanediol, 1,6-hexanediol, 1,14-decamethylene glycol, etc.; aromatic glycols such as bis-(4-oxyphenyl)methane, 1,1-bis(4-oxyphenyl)methane, 1,1-bis(4-oxyphenyl)-ethane, 1,1-bis(4-oxyphenyl)butane, 1,1-bis(4-oxyphenyl)isobutane, 1,1-bis(4-oxyphenyl)cyclohexane, 2,2-bis(4-oxydiphenyl)butane, m-xylylene glycol, p-xylylene glycol, etc.; and adducts of alkylene oxide with the foregoing bis(4-oxyphenyl)alkanes or cycloalkanes, tertiary nitrogen-containing glycols such as N-methyldiethanolamine, 2,2'-phenyliminodiethanol, etc., sulfur-containing glycols such as 2,2'-thiodiethanol, polyoxyethylene glycol (preferably, polyoxyethylene glycol having a molecular weight of 200 to 4,000), polyoxypropylene glycol (preferably, polyoxypropylene glycol having a molecular weight of 200 to 4,000), polytetramethylene ether glycol (preferably, polytetramethylene ether glycol having a molecular weight of 200 to 4,000), poly(oxyethylene-oxypropylene)glycol, poly(oxyethylene-oxytetramethylene)glycol, α,ω-1,2-polybutadiene glycol and its hydrogenated product, α,ω-1,4-polybutadiene glycol and its hydrogenated product, α,ω-1,2-polybutadiene/1,4-polybutadiene glycol and its hydrogenated product, polyesterdiols such as polyesters (including oligoesters) having a molecular weight of 200 to 6,000 of which the both terminals are substantially, hydroxyl groups, i.e. polyesters obtained from the well-known dicarboxylic acids or/and their diesters, glycols, oxyacids, etc., polycaprolactonediols and the like. These glycols may be used alone or in combination. Those which are preferred in the present invention are polyoxyethylene glycol (having a molecular weight of 200 to 4,000), polyoxypropylene glycol (having a molecular weight of 200 to 4,000) and poly(oxyethylene-oxypropylene)glycol (having a molecular weight of 200 to 4,000).

For producing diisocyanate compounds substantially having isocyanate groups at the both terminals by addition reaction of the foregoing diisocyanate compounds with glycols, the conventionally well-known methods may be employed. For example, there may be given a method to react the both components under mixing/-stirring without a solvent, a method to react the both components in solution in an inert solvent, and the like. The reaction temperature and reaction time should be determined so as to obtain an optimum condition taking into account the reactivity and thermal stability of the both. The reaction ratio of the both is not less than 2.0, particularly preferably not less than 2.05 as expressed in NCO/OH (equivalent ratio).

Hereupon, it is permissible that the diisocyanate compound remains partly unreacted because of its excess addition, so far as there is no adverse effect on the subsequent reaction with the amide compound of which the both terminals are substantially a primary and/or a secondary amino group.

For the reaction of amide compound with diisocyanate compound used in the present invention, there may be employed a method in which diisocyanate is slowly added, as such or in solution, to the solution of amide with stirring, a method in which the both are mixed in a molten state to bring them into reaction, and the like. In the reaction of the both, diisocyanate may be used in the well-known protected form such as lactam, so far as there is no adverse effect on the reaction.

The reaction ratio of the both, as expressed in the equivalent ratio of a primary and/or a secondary amino group to an isocyanate group, is not less than 1.0, preferably not less than 1.02. In this case, there is no special problem in that excess terminal amino group remains unreacted, so far as there is no adverse effect on the performance and physical property of compositions resulting therefrom. When the above equivalent ratio is less than 1.0, unfavorable reactions such as gelation are so easy to occur that such ratio is not preferred. Because of an extremely great reactivity between amine and isocyanate, the reaction of the both will proceed even in an active solvent such as water, alcohols (e.g. methanol) or mixtures of water and alcohols, and besides it comes to an end rapidly. Also, said reaction should be carried out under an optimum condition suited to the system, but it will proceed rapidly even at relatively low temperatures such as room temperature. Further in said reaction, the molecular weight of the formed filling polymer having amide bond(s) and urea bond(s) within the molecule can easily be controlled by varing the reaction ratio of primary and/or secondary amino groups to isocyanate groups (equivalent ratio). These are great advantages of the present invention.

The filling polymer of the present invention thus obtained having amide bond(s) and urea bond(s) within the molecule can be used together with other filling polymers having the both bonds at the same time. As examples of such soluble high-molecular compound, there are given for example the conventionally well-known polymers such as polyamide, polyester, polyurea, polyurethane, vinyl polymers (e.g. polyvinyl actate, polyvinyl alcohol) and the like. These polymers may be not only a homopolymer, but also a random copolymer, block polymer and a mixture of these polymers. The content of the polymer not having both amide and urea bonds at the same time within the molecule, as contained in the filling polymer, is preferably not more than 50 wt. %.

The content of the filling polymer used in the present invention is 25 to 95 wt. % of the whole composition. When the content is less than 25 wt. % or exceeds 95 wt. %, the performance of compositions obtained therefrom is not desirable.

The photopolymerizable unsaturated compound used in the present invention refers to compounds having one or more photopolymerizable unsaturated groups in the molecule, and the well-known compounds may be used. As such compounds, there may be given for example those having one unsaturated bond such as (meth)acrylic acid, maleic acid, fumaric acid, crotonic acid, itaconic acid, cinnamic acid, methyl (meth)acrylate, benzyl (meth)acrylate, tribromophenyl (meth)acrylate, 3-chloro-2-oxypropy (meth)acrylate, cyclohexyl (meth)acrylate, 2-hydroxyethyl (meth)acrylate, 2-hydroxypropyl (meth)acrylate, N,N-dimethylaminoethyl (meth)acrylate, N,N-diethylaminoethyl (meth)acrylate, monoester carboxylic acids obtained by reaction between aliphatic dicarboxylic acids (anhydrides) and 2-hydroxyethyl (meth)acrylate, glycidyl (meth)acrylate, (meth)acrylamide, N-methoylol(meth)acrylamide, N-methylol(meth)acrylamide-n-butyl ether, diacetone acrylamide, N-tert-butyl(meth)acrylamide, sodium (meth)acrylate, ammonium (meth)acrylate, acrylonitrile, styrene, sodium styrenesulfonate, vinylpyridine, ring-opened addition products of glycidyl (meth)acrylate with a monoalcohol, 2-acrylamide-2-methylpropanesulfonic acid, etc.; and compounds having two or more unsaturated bonds such as allyl (meth)acrylate, ethylene glycol di(meth)acrylate, 1,3-propanediol di(meth)acrylate, 1,4-butanediol di(meth)acrylate, 1,6-hexanediol di(meth)acrylate, trimethylolethane di(meth)acrylate, trimethylolethane tri(meth)acrylate, trimethylolpropane di(meth)acrylate, trimethylolpropane tri(meth)acrylate, tetramethylolmethane di(meth)acrylate, tetramethylolmethane tri(meth)acrylate, tetramethylolmethane tetra(meth) acrylate, tri(meth)acryloyloxyethyl phosphate, triester of tris(2-hydroxyethyl)isocyanuric acid with (meth)acrylic acid, ring-opened addition products between polyglycidyl ether of polyhydric alcohol and (meth)acrylic acid such as for example reaction products between diglycidyl ether of (poly)ethylene glycol and (meth)acrylic acid, reaction products between diglycidyl ether of (poly)propylene glycol and (meth)acrylic acid, reaction products between diglycidyl ether of 1,6-hexamethylene glycol and (meth)acrylic acid, reaction products between glycerin diglycidyl ether and (meth)acrylic acid, reaction products between trimethylolethane triglycidyl ether and (meth)acrylic acid, reaction products between trimethylolpropane triglycidyl ether and (meth)acrylic acid, reaction products between isophthalic acid and diglycidyl ether and (meth)acrylic acid, and reaction products between diglycidyl ether of isoprene oligomer dicarboxylic acid and (meth)acrylic acid, ring-opened addition products between other active hydrogen compounds and glycidyl (meth)acrylate such as for example reaction products between (poly)ethylene glycol and glycidyl (meth)acrylate, reaction products between (poly)propylene glycol and glycidyl (meth)acrylate, reaction products between glycerin and glycidyl (meth)acrylate, reaction products between 2-hydroxyethyl (meth)acrylate and glycidyl (meth)acrylate, reaction products between trimethylolethane and glycidyl (meth)acrylate, reaction products between trimethylolpropane and glycidyl (meth)acrylate, reaction products between (meth)acrylic acid and glycidyl (meth)acrylate, reaction products between aliphatic polycarboxylic acid and glycidyl (meth)acrylate and reaction products between aromatic polycarboxylic acid and glycidyl (meth)acrylate, compounds having two or more unsaturated groups obtained by reaction between compounds having a primary or secondary amino group and glycidyl (meth)acrylate, N,N'-methylenebis(meth)acrylamide, N,N'-ethylenebis(meth)acrylamide, N,N'-propylenebis(meth)acrylamide, N,N'-hexamethylenebis(meth)acrylamide, N,N'-phenylenebis(meth)acrylamide, N,N'-m-xylylenebis(meth)acrylamide, di(-meth)acrylamide-N-methyl ether, 1,3-[bis(meth)acryloylaminomethyl]urea and its derivatives, 1,3-[bis(-meth)acryloylaminomethyl]-1,3-dimethylurea and its derivatives, 1,3-[bis(meth)acryloylaminomethyl]ethyleneurea and its derivatives, 1,3-[bis(meth)acryloylaminomethyl]trimethyleneurea and its derivatives, triacrylformal, tri(meth)acrylate of tris(2-hydroxyethyl)isocyanuric acid, reaction products between 1,3-diglycidyl-5-methyl,5-ethylhydantoin and (meth)acrylic acid, and the like.

The photopolymerizable unsaturated compound may be used alone or in a mixture of two or more kinds of the compound. The amount of the compound used is 5 to 200 wt. %, particularly preferably 10 to 150 wt. % based on the filling polymer in the composition. When the amount is less than 5 wt. %, the resistance to solvent of the exposed portion is not sufficient, and when it exceeds 200 wt. %, the mechanical strength of the composition after exposure is damaged, so that such amounts are not desirable.

The photopolymerization initiator used in the present invention is a compound to initiate, promote or strengthen the polymerization of the foregoing photopolymerizable unsaturated compound within the composition, and the conventionally well-known compounds may be used. As examples of such compound, there may be given for example benzophenones such as benzophenone, p-aminobenzophenone, p-chlorobenzophenone, etc., anthraquinones such as 9,10-anthraquinone, 1-chloroanthraquinone, 2-chloroanthraquinone, etc., benzoins such as benzoin, benzoin methyl ether, benzoin ethyl ether, benzoin isopropyl ether, α-methylbenzoin, etc., benzils such as benzils, benzil dimethyl ketal, etc., benzyl liboflavin, uranyl nitrate, halogen compounds, sulfur compounds and the like. The amount of the photopolymerization initiator used is not particularly limited, but it is 0.01 to 10 wt. %, preferably 0.05 to 5 wt. % of the whole composition. These compounds may be used in a mixture of two or more of them.

The well-known thermal polymerization inhibitor may be added if necessary. This inhibitor is added for the purpose of preventing the photopolymerizable unsaturated compound from unfavorable thermal polymerization caused by heating on the compounding, production and molding of the composition, or of preventing the composition from dark reaction on storage. As examples of such compound, there may be given for example hydroquinones such as hydroquinone, mono-tert-butylhydroquinone, 2,5-di-tert-butylhydroquinone, hydroquinone monomethyl ether, etc., benzoquinones such as benzoquinone, 2,5-diphenyl-p-benzoquinone, etc., phenols, catechols such as catechol, p-tert-butylcatechol, etc., aromatic amines, picric acids, phenothiazine, α-naphthoquinones, anthraquinones, nitro compounds, sulfur compounds and the like. The amount of the inhibitor used is 0.001 to 2 wt. %, particularly preferably 0.005 to 1 wt. % of the whole composition. These compounds may be used in a mixture of two or more of them.

To the composition of the present invention may be added other additives such as plasticizers, pigments, dyes, stabilizers, etc., so far as they do no special damage to the photosensitive performance, physical property, etc. of the composition.

When the composition of the present invention is irradiated with active rays, for example rays from the well-known light sources such as various mercury lamps, carbon arc lamps, xenon lamps, UV fluorescent lamps, the sun and the like, the photopolymerization and photocrosslinking of unsaturated groups in the composition occur and proceed, whereby the composition at the exposed portion is made insoluble and hardens.

Mixing of the filling polymer, photopolymerizable unsaturated compound and photopolymerization initiator of the present invention and if necessary the thermal polymerization inhibitor and other additives such as plasticizers may be carried out according to the well-known optional methods. For example, there are a method to mix these components in a molten state, a method to mix these components in solution in a suitable solvent such as alcohol and then to remove the solvent, and the like. Also, the composition of the present invention can be formed into sheet-like products such as plates, films foils, etc. having a desired thickness by the well-known optional methods such as heat pressing, casting, melt extrusion, solution casting and the like. This sheet-like product may be laminated on a support with or without a well-known adhesive between the both.

As the support, there may be used optional ones such as steel, aluminum, glass, plastic films such as polyester film, vaporized metal-deposited film and the like.

A photosensitive original plate comprising a simple layer of this composition or said layer and a support, when its photosensitive layer is closely contacted with a negative or positive film having a transparent image portion, and exposed by irradiation with active ray from the film, turns insoluble and hardens at only the exposed portion. Thereafter, by dissolving and removing the non-exposed portion by means of a suitable solvent, a relief printing plate having a distinct image portion can be obtained.

As a suitable solvent for dissolving and removing the non-exposed portion, there may be given for example water, various aqueous acid solutions, aqueous alkali solutions, lower fatty alcohols, and mixed solutions such as water/alcohol mixtures, water/alcohol/benzene mixtures, mixtures of a lower alcohol with calcium chloride or zinc chloride, etc.

The composition of the present invention as described above is superior in physical properties such as solvent resistance, abrasion resistance, etc. because a part or all of the filling polymer contains the polyamide component in the molecular chain. For example, when the composition is used as the material of plates for relief printing, it is superior in long press life, spreading of ink and transferability, giving prints of a faithful reproduction of original images. Further, the filling polymer of the present invention, since it contains urea bond(s) in addition to amide bond(s) in its molecules, is superior in compatibility with the photo-polymerizable unsaturated compound. Consequently, large quantites of the compound can be blended so that the photo-curability of the composition is extremely good. Further, unfavorable phenomena such as bleed-out of photopolymerizable unsaturated compound are not observable even after prolonged storage of the composition.

Further, in producing the filling polymer of the present invention, a part of all of the polymer is obtained by the reaction of amine with isocyanate as described above, and because of an extremely large reactivity between the both, not only inert solvents but also highly reactive ones such as methyl alcohol may be used for the reaction, which means that the selectivity of usuable solvent is very wide. Further, in the reaction of amine with isocyanate, by proper selection of the respective molecular weights or the reaction ratio of the both, the physical properties (e.g. hardness and elasticity) after photo-curing of the composition obtained therefrom can easily be controlled, whereby products having a wide range of hardness ranging from high-hardness products to extremely soft and elasticity-rich ones can be produced which could not be obtained by curing of the conventional compositions obtained with polyamide alone as filling polymer. Further, by proper selection of the reaction ratio of amine to diisocyanate, such high molecular weight polymers as to be difficult to obtain by melt polymerization of the conventional polyamides can easily be produced.

As described above, the reaction of amine with isocyanate according to the present invention has a characteristic that it can be made use of for improvement in the physical property of compositions.

The composition of the present invention can be effectively used for various uses such as relief plates for various kinds of printing, paper molds, relief plates for matrix, relief marks for sandbust, patterns for screen printing, lithography, intaglio printing and decoration, displays, name plates, photo-resists, photo-curable inks, photo-curable paints, photo-adhesive, various molded products, ion-exchange resins (membranes), selective permeable membranes, membranes for immobilized enzyme and the like.

Next, the present invention will be illustrated specifically with reference to the following examples, but it is not to be interpreted as being limited to these examples. Part simply referred to in the examples is part by weight.

REFERENCE EXAMPLE 1

1005 parts of a nylon salt obtained from 500 parts of N,N'-bis (3-aminopropyl)piperazine and 505 parts of sebacic acid and 125 parts of N,N'-bis (3-aminopropyl)-piperazine as an agent which makes the terminals primary amino groups (also acting as a viscosity-stabilizer) were melt-polycondensed in an autoclave to obtain an almost colorless, -insoluble and alcohol-soluble nylon oligomer having a specific viscosity of 1.37, an average molecular weight of about 1900 and both terminals which were substantially primary amino groups.

One hundred parts of this nylon oligomer was dissolved in 1000 parts of methanol, and 9.9 parts of isophorone diisocyanate was gradually poured into this solution with stirring. The reaction of the both was completed at room temperature in about 15 minutes. This reaction solution was cast in a Teflon-coated Schale, and after evaporation-removal of the methanol, dried under reduced pressure to obtain a polymer having amide and urea bonds within the molecule. This polymer was almost colorless and transparent, stiff and substantially insoluble in neutral water, and had a melting point of about 162° C. and a specific viscosity of 3.15.

EXAMPLE 1

Fifty-five parts of the polymer obtained in reference example 1 was dissolved in 300 parts of methanol, and to this solution were added 9 parts of methacrylic acid (combining a function to make the above polymer water-soluble by forming ammonium salts together with the basic tertiary nitrogen atom of the piperazine ring in the main chain of the polymer and with the terminal primary amino group of the polymer and a function to act as photopolymerizable unsaturated compound), 28 parts of a reaction product of 1,3-diglycidyl-5-methyl,5-ethylhydantoin with methacrylic acid, 7 parts of p-toluenesulfone-N-ethylamide, 0.1 part of hydroquinone monomethyl ether and 1.0 part of benzyl dimethyl ketal to obtain a solution of photosensitive resin composition. This solution was spread on a Teflon-coated Schale, and after evaporation-removal of the methanol in a dark place, dried at 40° C. under reduced pressure for further whole day and night to obtain a sheet of composition having a thickness of about 800μ. This sheet was stuck on a polyester film of 250μ in thickness with a brown pigment-containing adhesive coated on the film, the upper surface of the composition was covered with a polyester film of 125μ in thickness and the whole was heat-pressed at 110° C. to prepare a photosensitive resin original plate of which the photosensitive resin layer had a thickness of about 700μ. Thereafter, the covering film was peeled off the original plate, and to the surface of the photosensitive resin layer was closely stuck a halftone negative film of 150 line/inch. After the minutes' exposure to a chemical lamp, the negative film was peeled off, and the exposed resin layer was developed for 3 min. and 15 sec. with neutral water by a brush type washer, followed by drying and post exposure. The relief plate obtained was of a faithful reproductivity of the original image. The hardness of this relief plate was as extremely large as about 84° in Shore D, and besides it was tough and difficult to break.

COMPARATIVE EXAMPLE 1

550 parts of ε-caprolactam and 450 parts of a nylon salt obtained from 260 parts of N,N'-bis(3-aminopropyl)piperazine and 190 parts of adipic acid were melt-polycondensed in an autoclave to obtain a pale yellow and transparent copolymerized nylon having a specific viscosity of 2.52 and being soluble in alcohol and substantially insoluble in water.

To a solution of 55 parts of this copolymerized nylon in 300 parts of methanol were added the same compounds as in example 1, that is, 9 parts of methacrylic acid, 28 parts of a reaction product of 1,3-diglycidyl-5-methyl,5-ethylhydantoin with methacrylic acid, 7 parts of p-toluenesulfone-N-ethylamide, 0.1 part of hydroquinone monoethyl ether and 1.0 part of benzyl dimethyl ketal, to obtain a solution of photosensitive resin coposition. In the same manner as in example 1, a photosensitive resin original plate was prepared, and after exposure, developed with neutral water, dried and post-exposed to obtain a relief plate. This plate was of a faithful reproductivity of the original image, but its hardness was only 73° in Shore D.

REFERENCE EXAMPLE 2

402 parts of a nylon salt obtained from 200 parts of N,N'-bis(3-aminopropyl)piperazine and 202 parts of sebacic acid, 86.5 parts of a nylon salt obtained from 50 parts of N,N'-bis(3-aminopropyl)piperizine and 36.5 parts of adipic acid and 83.3 parts of N,N'bis (3-aminopropyl)piperazine as an agent which makes the terminals primary amino groups (also acting as a viscosity-stabilizer), were melt-polycondensed in an autoclave to obtain an almost colorless and opaque, water-insoluble and alcohol-soluble copolymerized nylon oligomer having a specific viscosity of 1.26, a melting point of about 145° C., an average molecular weight of about 1500 and the both terminals which were substantially primary amino groups.

Separately from this, a urethane oligomer substantially having isocyanate groups at the both terminals was obtained by reacting 500 parts of polypropylene glycol (average molecular weight, 2000) with 95 parts of hexamethylene diisocyanate.

Thereafter, 100 parts of the copolymerized nylon oligomer obtained as above as dissolved in 500 parts of methanol, and to this solution was gradually added 123 parts of the foregoing urethane oligomer with stirring. The reaction of the both was completed in about 15 minutes. This reaction solution was cast in a Teflon-coated Schale, and after evaporation-removal of the methanol, dried under reduced pressure to obtain a polymer having amide, urethane and urea bonds within the molecule. This polymer was pale yellow, transparent and substantially insoluble in neutral water and had a softening point of about 95° to about 105° C., a specific viscosity of about 2.63 and both flexibility and rubber elasticity.

EXAMPLE 2

Fifty-five parts of the polymer obtained in reference example 2 was dissolved in 200 parts of methanol, and to this solution were added 12 parts of a monoester monocarboxylic acid (which makes the above polymer water-soluble by forming ammonium salts together with the basic tertiary nitrogen atom of the piperazine ring in the main chain of the polymer and with the terminal amino groups of the polymer) obtained by the reaction of polyethylene glycol (molecular weight, 200) with succinic acid anhydride, 27 parts of a diacrylate obtained by the ring-opened addition reaction of a diglycidyl ether of polypropylene glycol (average molecular weight, 200) with acrylic acid, 5 parts of p-toluene-sulfone-N-ethylamide, 0.1 part of hydroquinone monomethyl ether and 1.0 part of benzyl dimethyl ketal to obtain a homogeneous solution. This solution was spread on a Teflon-coated Schale, and after evaporation-removal of the methanol in a dark place, dried at 40° C. under reduced pressure for further whole day and night to obtain a sheet of photosensitive resin composition having a thickness of about 800μ.

This sheet was stuck on a polyester film of 250μ in thickness with a brown pigment-containing adhesive coated on the film, and the upper surface of the composition was covered with a polyester film of 125μ in thickness having a corona-treated surface on which poval (saponification degree, 98%) was coated in a thickness of about 1.6μ, so that the poval surface closely stuck to the composition. The whole was then heat-pressed at 100° C. to obtain a photosensitive resin plate of which the photosensitive resin layer had a thickness of about 700μ. Thereafter, the covering film was peeled off this original plate (the poval was transferred to the surface of the photosensitive resin layer and remained on the layer), and by the same procedure as in example 1, were carried out exposure (4 minutes), development with neutral water (5.5 minutes), drying and post exposure. The relief plate obtained was of a faithful reproductivity of the original image. The hardness of this relief plate as extremely soft as 55° in Shore A, showing a good rubber elasticity, and besides the plate had a superior printability.

COMPARATIVE EXAMPLE 3

The whole procedure of example 2 was repeated except that the copolymerized nylon used in comparative example 1 was used in place of the polymer used in example 2. The relief plate obtained was of a faithful reproductivity of the original image, but its hardness was as high as 91° in Shore A, showing little rubber elasticity.

REFERENCE EXAMPLE 3

Five hundred parts of ε-caprolactum, 575 parts of a nylon salt obtained from 270 parts of N-(2-aminoethyl)-piperazine and 305 parts of a adipic acid and 40 parts of N-(2aminoethyl)piperazine as an agent which makes the terminals primary and/or secondary amino groups (also acting as a polymerization degree-regulating agent), were melt-polycondensed in an autoclave to obtain a pale yellow, transparent and alcohol-soluble copolymerized nylon oligomer having a specific viscosity of 1.40, an average molecular weight of about 3050 and the both terminals which are substantially a primary or/and a secondary amino group.

Separately from this, a urethane oligomer substantially having an isocyanate group at the both terminals was obtained by reacting 750 parts of polypropylene glycol (average molecular weight, 1000) with 300 parts of hexamethylene diisocyanate.

Thereafter, 92 parts of the copolymerized nylon oligomer obtained as above was dissolved in 200 parts of methanol, and into this solution was gradually poured 18 parts of the foregoing urethane oligomer at 50° C. with stirring. The reaction of the both was completed in about 15 minutes. The viscosity of the reaction solution was about 180 poises. This pale yellow and transparent solution was cast in a Teflon-coated Schale, and the methanol was removed by evaporation to obtain a polymer having amide, urethane and urea bonds within the molecule. This polymer was pale yellow, semitransparent and substantially insoluble in neutral water and had a softening point of 85° to 95° C., a specific viscosity of 2.20 and both flexibility and elasticity.

EXAMPLE 3

Fifty-five parts of the polymer obtained in Reference example 3 was dissolved in 100 parts of methanol, and to this solution were added 4 part of adipic acid (which makes the above polymer water-soluble by forming ammonium salts together with the basic tertiary nitrogen atom of the piperazine ring in the main chain of the polymer and with the terminal amino groups of the polymer), 20 parts of hydroxyethyl methacrylate, 20 parts of triethylene glycol diacrylate, 0.1 part of hydroquinone monomethyl ether and 1.0 part of benzoin methyl ether to obtain a solution of photosensitive resin composition. This solution was spread on a Teflon-coated Schale, and after evaporation-removal of the methanol in a dark place, dried at 40° C. under reduced pressure for further whole day and night to obtain a sheet of about 800μ in thicknes. This sheet was stuck on a polyester film of 250μ in thickness with a brown pigment-containing adhesive coated on the film, the upper surface of the composition was covered with a polyester film of 125μ in thickness, and the whole was heat-pressed at 100° C. to obtain a photosensitive resin original plate of which the photosensitive resin layer had a thickness of about 700μ. Thereafter, the covering film was peeled off the original plate, and to the surface of the photosensitive resin layer was closely stuck a halftone negative film of 150 line/inch. After four minutes' exposure to a chemical lamp, the negative film was peeled off, and the exposed resin layer was developed for 2 min. and 15 sec. with neutral water by a brush type washer, followed by drying and post exposure. The relief plate obtained was of a faithful reproductivity of the original image, and had both flexibility and a good printability. The hardness of the relief layer was about 85° in Shore A.

EXAMPLE 4

Fifty-five part of the polymer obtained in reference example 3 having amide, urethane and urea bonds within the molecule, was dissolved in 100 part of methanol, and to 155 parts of this solution were added 20 parts of hydroxypropyl acrylate, 25 parts of propylene glycol (average molecular weight, 400) diacrylate, 0.1 part of hydroquinone monomethyl ether and 1.0 part of benzoin methyl ether, and dissolved uniformly. From this solution was prepared, in the same manner as in example 3, a photosensitive resin original plate of which the photosensitive resin layer had a thickness of about 700μ, and exposed to light similarly. After the exposure, the exposed resin layer was developed with ethanol containing 5% of water by a brush type washer, followed by drying and post exposure. The relief plate obtained was of a faithful reproductivity of the original image and had both flexibility and a good printability. The hardness of the relief layer was about 71° in Shore A.

REFERENCE EXAMPLE 4

Five hundred part of ε-caprolactam, 560 parts of a nylon salt obtained from 324 parts of N,N'-bis(3-aminopropyl)piperazine and 236 parts of adipic acid and 63 parts of N,N'-bis(3-aminopropyl) piperazine as an agent which makes the terminals primary amino groups (also acting as a viscosity-stabilizer), were fusion-polycondensed in an autoclave to obtain a pale yellow, transparent and alcohol-soluble copolymerized nylon oligomer having a specific viscosity of 1.55 and the both terminals which were substantially primary amino groups.

Fourty-six parts of this copolymerized nylon oligomer was dissolved in 100 parts of methanol and reacted with 9 parts of the urethane oligomer obtained in Reference example 3 substantially having isocyanate groups at the both terminals by the method described in reference example 3, to obtain a pale yellow and transparent polymer solution having a viscosity of about 200 poises. From this solution, the methanol was removed to obtain a polymer having amide, urethane and urea bonds within the molecule. This polymer was pale yellow and slightly turbid and had a softening point of 75° to 85° C., a specific viscosity of 2.40 and elasticity. This polymer was insoluble in neutral water.

EXAMPLE 5

Fifty-five parts of the polymer obtained in reference example 4 was dissolved in 100 parts of methanol, and to this solution were added 8 parts of methacrylic acid (combining a function to make the above polymer water-soluble by forming ammonium salts together with the basic tertiary nitrogen atom of the piperazine ring in the main chain of the polymer and with the terminal amino groups of the polymer and a function to act as a photopolymerizable unsaturated compound), 12 parts of acrylamide, 25 parts of polyethylene glycol (average molecular weight, 200) diacrylate, 0.1 part of hydroquinone monomethyl ether and 1.0 part of benzoin methyl ether, and dissolved uniformly. From this solution was prepared, in the same manner as in example 3, a photosensitive resin original plate of which the photosenitive resin layer had a thickness of about 700μ, followed by exposure to light, development with neutral water, drying and post exposure. The relief plate obtained was of a faithful reproductivity of the original image, and had both flexibility and a good printability. The hardnes of the relief layer was about 84° in Shore A.

EXAMPLES 6 to 9

Filling polymers were obtained using the amide compounds, agent which make the terminals primary and/or secondary amino groups and diisocyanate compounds shown in Table 1. Fifty-five parts of each polymer was dissolved in 300 parts of methanol, and to this solution were added 9 part of hydroxyethyl methacrylate, 28 parts of a reaction product of 1,3-diglycidyl-5-methyl,5-ethylhydantoin with methacrylic acid, 6.9 parts of p-toluenesulfone-N-ethylamide, 1.0 part of benzoin monoethyl ether and 0.1 part of hydroquinone monomethyl ether to obtain a solution of photosensitive resin composition. From this solution was prepared, in the same manner as in example 1, a photosensitive resin original plate. The characteristics of the original plates and printing plates obtained in the same manner as in example 1 are shown together in Table 1.

TABLE 1

|  | Example 6 | Example 7 | Example 8 | Example 9 |
|---|---|---|---|---|
| Filling polymer |  |  |  |  |
| Amide compound (blending weight ratio) | Nylon 6/6,6/6,10 copolyamide (35/35/30) | Nylon 6/6,6/4,4'-diaminodicyclohexyl-methane · isophthalic acid copolyamide (40/35/25) | Nylon 6/6,6/α,ω-diaminopolyoxy ethylene · adipic acid copolyamide (35/35/30) | Nylon 6/1,3-bis-(aminomethyl)cyclo-hexane · adipic acid copolyamide (50/50) |
| Agent which makes the terminals a primary and or a secondary amino group | Hexamethylene diamine | 4,4'-Diaminodicyclo-hexylmethane | Hexamethylene diamine | 1,3-Bis(aminomethyl) cyclohexane |
| Number average molecular weight of amide compound | 3,600 | 2,900 | 4,300 | 1,300 |
| Diisocyanate compound (reaction ratio $NCO/NH_2 = 0.8$) | Isophorone diisocyanate | Reaction product of polyoxypropylene glycol (molecular weight, 1000) with isophorone diisocyanate | 1,3-Cyclohexane dimethylisocyanate | Reaction product of polyoxyethylene glycol (molecular weight, 600) with hexamethylene diisocyanate |
| Specific viscosity (96% sulfuric acid) of filling polymer | 3.15 | 2.63 | 2.38 | 2.55 |
| Long-term storage stability of photosensitive resin composition (six months) | No change | No change | No change | No change |
| Characteristics of printing plate |  |  |  |  |
| Developability [ethyl alcohol/water = 85/15(volume ratio)] | Good | Good | Good | Good |
| Reproductivity | 150 line/inch or more | 150 line/inch or more | 150 line/inch or more | 150 line/inch or more |
| Ink transferability | 54% | 62% | 52% | 58% |
| Hardness (Shore D) | 63 | 40 | 62 | 45 |
| Long press life (65% RH, 20° C.) | 500,000 copies or more | 500,000 copies or more | 500,000 copies or more | 500,000 copies or more |

What is claimed is:

1. A photosensitive resin composition consisting essentially of a soluble synthetic linear high-molecular compound in an amount of 25 to 95 wt % based on the whole composition, a monomer having at least one photopolymerizable unsaturated bond and a photopolymerization initiator and characterized in that the soluble synthetic linear high-molecular compound is selected from; (a) an addition polymer of an organic diisocyanate compound with an amide compound, both terminals of said amide compound being primary and/or secondary amino groups and wherein the equivalent ratio of amino groups to isocyanate groups in the addition polymer is not less than 1.0; or (b) said addition polymer in combination with another polymer which is selected from the group consisting of polyamides, polyesters, polyureas, polyurethanes and vinyl plylmers which may be homopolylmers or coplymers, random and block, or a mixtures of the polymers, and the content of said other polymer being not more than 50% by weight based on the total amount of the polymer material.

2. A photosensitive resin composition as defined in claim (1) characterized in that the soluble synthetic linear high-molecular compound contains not less than 5 wt % of the amide compound both terminals of which are capable of reacting with the organic diisocyanate compound and are primary and/or secondary amino groups.

3. A photosensitive resin composition as defined in claim (1) or (2) wherein the amide compound having both terminals which are primary and/or secondary amino groups and at least one amide bond has an average molecular weight of 300 to 20,000.

4. A photosensitive rein composition as defined in claim (3) wherein the amide compound having both terminals which are primary and/or secondary amino groups and at least one amide bond has a basic tertiary nitrogen atom and/or a quaternary ammonium salt in the main chain and/or side chain thereof.

5. A photosensitive resin composition as defined in claim (1) wherein the organic diisocyanate compound is one obtained by reacting a glycol with a diisocyanate compound and having isocyanate groups at both terminals.

6. A photosensitive resin composition as defined in claim (1) wherein the reaction ratio (weight ratio) of the amide compound having both terminals which are substantially primary and/or secondary amino groups and at least one amide bond to the organic diisocyanate compound is 97:3 to 3:97.

* * * * *

UNITED STATES PATENT AND TRADEMARK OFFICE
CERTIFICATE OF CORRECTION

PATENT NO. : 4,544,624

DATED : October 1, 1985

INVENTOR(S) : NANPEI ET AL

It is certified that error appears in the above-identified patent and that said Letters Patent is hereby corrected as shown below: Title page:

IN THE ABSTRACT

Line 10: amend "primary or" to --primary and/or--.
Line 13: delete "weight".

Signed and Sealed this

First Day of July 1986

[SEAL]

Attest:

DONALD J. QUIGG

Attesting Officer

Commissioner of Patents and Trademarks